(12) United States Patent
Matsumoto et al.

(10) Patent No.: US 12,341,320 B2
(45) Date of Patent: Jun. 24, 2025

(54) OPTICAL COMBINER AND LASER APPARATUS

(71) Applicant: FUJIKURA LTD., Tokyo (JP)

(72) Inventors: Ryokichi Matsumoto, Chiba (JP); Tomoyuki Fujita, Chiba (JP); Kiwamu Suzuki, Chiba (JP)

(73) Assignee: FUJIKURA LTD., Tokyo (JP)

( * ) Notice: Subject to any disclaimer, the term of this patent is extended or adjusted under 35 U.S.C. 154(b) by 347 days.

(21) Appl. No.: 17/927,266

(22) PCT Filed: Feb. 19, 2021

(86) PCT No.: PCT/JP2021/006257
§ 371 (c)(1),
(2) Date: Nov. 22, 2022

(87) PCT Pub. No.: WO2021/240916
PCT Pub. Date: Dec. 2, 2021

(65) Prior Publication Data
US 2023/0208109 A1  Jun. 29, 2023

(30) Foreign Application Priority Data
May 26, 2020  (JP) .................................. 2020-091710

(51) Int. Cl.
*H01S 3/30* (2006.01)
*H01S 5/14* (2006.01)
(Continued)

(52) U.S. Cl.
CPC ............ *H01S 5/4012* (2013.01); *H01S 5/147* (2013.01); *G02B 6/0281* (2013.01);
(Continued)

(58) Field of Classification Search
CPC ...... H01S 5/4012; H01S 5/147; H01S 3/2383; H01S 5/02251
See application file for complete search history.

(56) References Cited

U.S. PATENT DOCUMENTS 7,199,924 B1 * 4/2007 Brown .................. H01S 3/2383
398/87
9,620,925 B2 * 4/2017 Keen ........................ G02B 6/04
(Continued)

FOREIGN PATENT DOCUMENTS

JP  2009265310 A  11/2009
JP  2012043820 A  3/2012
(Continued)

OTHER PUBLICATIONS

Extended European Search Report issued in corresponding European Patent Application No. 21814355.0, dated Jul. 12, 2024 (7 pages).

*Primary Examiner* — Kinam Park
(74) *Attorney, Agent, or Firm* — Osha Bergman Watanabe & Burton LLP

(57) ABSTRACT

An optical combiner includes: first optical input portions each including a first optical input waveguide; and an optical output portion to which the first optical input portions are connected and that includes a first core that allows light to propagate therethrough, and a cladding layer disposed outside of the first core and that has a refractive index lower than a refractive index of the first core. The first optical input portions are connected to a connection end face of the optical output portion such that the first optical input waveguide of at least one of the first optical input portions is optically coupled to the first core of the optical output portion.

12 Claims, 12 Drawing Sheets

(51) Int. Cl.
*H01S 5/40* (2006.01)
*G02B 6/028* (2006.01)
*G02B 6/036* (2006.01)
*H01S 3/23* (2006.01)
*H01S 5/02251* (2021.01)

(52) U.S. Cl.
CPC ........ *G02B 6/03622* (2013.01); *H01S 3/2383* (2013.01); *H01S 5/02251* (2021.01)

(56) References Cited

U.S. PATENT DOCUMENTS

| | | | |
|---|---|---|---|
| 2004/0013437 A1* | 1/2004 | Wiltsey | H04B 10/2581 398/183 |
| 2009/0154881 A1* | 6/2009 | Salokatve | G02B 6/2835 264/1.25 |
| 2014/0205236 A1* | 7/2014 | Noguchi | G02B 6/2835 385/33 |
| 2017/0293084 A1* | 10/2017 | Zhou | G02B 17/00 |
| 2019/0118299 A1 | 4/2019 | Kangastupa | |

FOREIGN PATENT DOCUMENTS

| | | |
|---|---|---|
| JP | 2013190714 A | 9/2013 |
| JP | 2017219628 A | 12/2017 |
| JP | 2018527184 A | 9/2018 |

* cited by examiner

OPTICAL COMBINER AND LASER APPARATUS

TECHNICAL FIELD

The present invention relates to an optical combiner and a laser apparatus, and more particularly to an optical combiner configured to combine light beams propagating through a plurality of optical fibers and output the combined light.

BACKGROUND

Optical combiners have widely been used to combine laser beams from a plurality of light sources to obtain a high-power laser beam. As such optical combiners, there has been known an optical combiner in which a plurality of input optical fibers are bundled and connected to an output optical fiber having a larger diameter by fusion splice (see, e.g., Patent Literature 1). In order to allow light to efficiently propagate from the input optical fibers to the output optical fiber in such an optical combiner, the output optical fiber commonly has an outside diameter that is greater than a diameter of the bundle of the input optical fibers.

If the bundle of the input optical fibers and the output optical fiber in this optical combiner are heated under the same conditions to connect the bundle of the input optical fibers and the output optical fiber to each other by fusion splice, the input optical fibers tend to be softened and melted earlier than the output optical fiber. This tendency is exhibited more significantly particularly when a gap is formed between the input optical fibers prior to the fusion splicing. Therefore, when those optical fibers are connected to each other by fusion splice, some countermeasures, such as heating the output optical fiber more intensely than the input optical fibers, need to be taken. Thus, it is not easy to conduct fusion splicing of the optical fibers.

PATENT LITERATURE

Patent Literature 1: U.S. Pat. No. 9,620,925 B2

SUMMARY

One or more embodiments of the present invention provide an optical combiner that can facilitate fusion splicing of an input optical part and an output optical part, and a laser apparatus including such an optical combiner.

According to one or more embodiments of the present invention, there is provided an optical combiner that can facilitate fusion splicing of an input optical part and an output optical part. The optical combiner has a plurality of first optical input portions each having a first optical input waveguide and an optical output portion to which the plurality of first optical input portions are connected. The optical output portion includes at least one core that allows light to propagate therethrough and an outermost cladding layer located outside of the at least one core with a refractive index lower than a refractive index of the at least one core. The plurality of first optical input portions are connected to a connection end face of the optical output portion such that the first optical input waveguide of at least one of the plurality of first optical input portions is optically coupled to the at least one core of the optical output portion. An outside diameter of the outermost cladding layer on the connection end face of the optical output portion is less than a diameter of a smallest inclusive circle including all of the plurality of first optical input portions on the connection end face of the optical output portion. In the specification, a circle circumscribed with one or more elements X has the same meaning as the smallest inclusive circle that includes all of one or more elements X and refers to a circle having the smallest diameter among circles including all of one or more elements X.

According to one or more embodiments of the present invention, there is provided a laser apparatus that can facilitate fusion splicing of an input optical part and an output optical part. The laser apparatus has a plurality of laser beam sources operable to generate a laser beam and the aforementioned optical combiner. The first optical input waveguides of the plurality of first optical input portions in the optical combiner are optically coupled to the plurality of laser beam sources.

DETAILED DESCRIPTION

Figure 1:
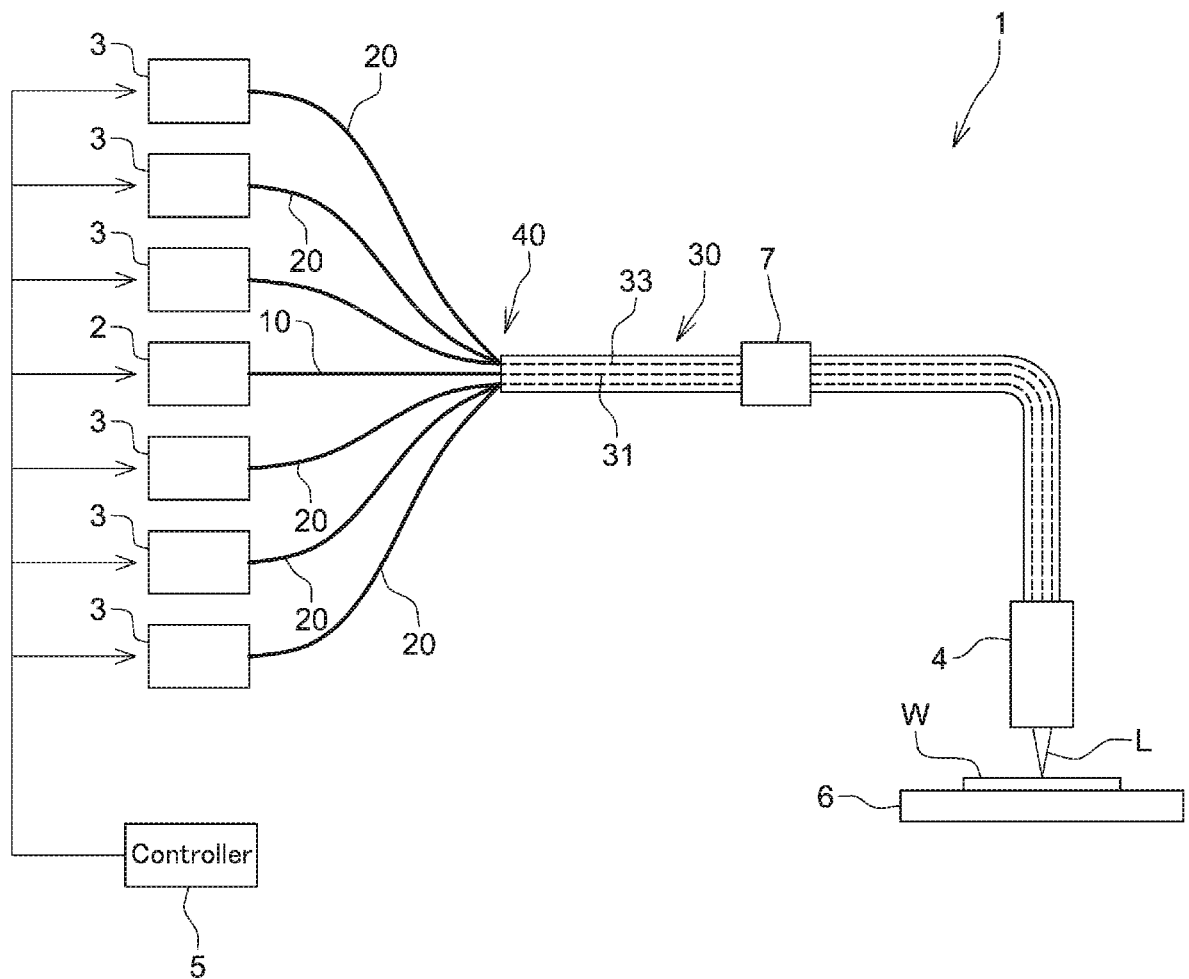
FIG. 1 is a schematic block diagram showing a configuration of a laser apparatus according to one or more embodiments of the present invention.

Embodiments of a laser apparatus including an optical combiner according to the present invention will be described in detail below with reference to FIGS. 1 to 12. In FIGS. 1 to 12, the same or corresponding components are denoted by the same or corresponding reference numerals and will not be described below repetitively. Furthermore, in FIGS. 1 to 12, the scales or dimensions of components may be exaggerated, or some components may be omitted. Unless mentioned otherwise, in the following description, terms such as "first," "second," etc. are only used to distinguish one component from another and are not used to indicate a specific order or a specific sequence.

FIG. 1 is a schematic block diagram showing a configuration of a laser apparatus 1 according to one or more embodiments of the present invention. As shown in FIG. 1, the laser apparatus 1 of one or more embodiments includes a laser beam source 2 operable to generate a laser beam, an optical fiber 10 connected to the laser beam source 2, a plurality of laser beam sources 3 operable to generate a laser beam, optical fibers 20 connected to the laser beam sources 3, an output optical fiber 30 connected to the optical fibers 10 and 20, an optical combiner 40 operable to combine the laser beams propagating through the optical fibers 10 and 20 and direct the combined laser beams to the output optical fiber 30, a laser emission portion 4 provided on an end of the output optical fiber 30, a controller 5 operable to control the laser beam sources 2 and 3, and a stage 6 that holds a workpiece W. For example, a fiber laser or a semiconductor laser may be employed for the laser beam sources 2 and 3. Unless otherwise mentioned herein, the term "downstream" refers to a direction from any of the laser beam sources 2 and 3 to the laser emission portion 4, and the term "upstream" refers to an opposite direction thereto in the following embodiments.

Figure 2:
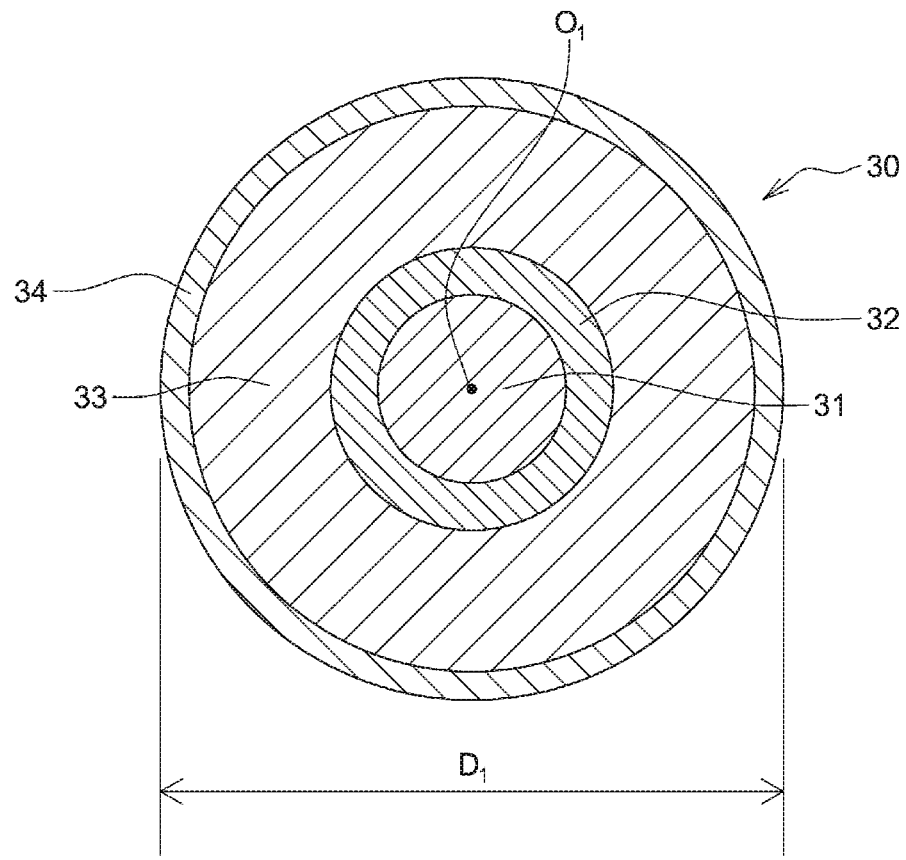
FIG. 2 is a diagram showing a cross-section of an output optical fiber of the laser apparatus illustrated in FIG. 1 along with a radial refractive index distribution.
Figure 2:
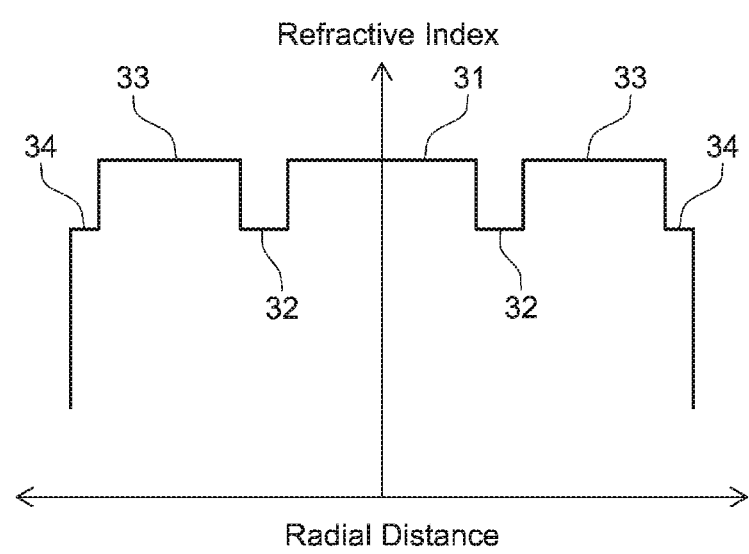

FIG. 2 shows a cross-section of the output optical fiber 30 along with a radial refractive index distribution. As shown in FIG. 2, the output optical fiber 30 has a center core 31 (first core), an inner cladding 32 (first cladding) that surrounds an outer circumference of the center core 31, a ring core 33 (second core) that surrounds an outer circumference of the inner cladding 32, and an outer cladding 34 (second cladding) that surrounds an outer circumference of the ring core 33.

The inner cladding 32 has a refractive index lower than refractive indices of the center core 31 and the ring core 33. The outer cladding 34 has a refractive index lower than a refractive index of the ring core 33. Thus, each of an interior of the center core 31 and an interior of the ring core 33 forms an optical waveguide that allows a laser beam to propagate therethrough. In this manner, according to one or more embodiments, the center core 31 and the ring core 33, which are optical waveguides independent of each other, are concentrically arranged within the output optical fiber 30. For example, the center core 31 and the ring core 33 may be formed of silica glass ($SiO_2$), and a dopant having a property to lower the refractive index (e.g., fluorine (F) or boron (B)) may be doped to the silica glass to form the inner cladding 32 and the outer cladding 34. Alternatively, the inner cladding 32 and the outer cladding 34 may be formed of silica glass ($SiO_2$), and a dopant having a property to increase the refractive index (e.g., germanium (Ge)) may be doped to form the center core 31 and the ring core 33.

In one or more embodiments, the inner cladding 32 is located on a radially inner side of the outer cladding 34. Thus, the outer cladding 34 is a cladding layer located at the outermost position in the output optical fiber 30, i.e., the outermost cladding layer. Furthermore, the ring core 33 is located, as the outermost core, adjacent to and on an inner side of to the outer cladding 34, which is the outermost cladding layer. An outer circumference of the outer cladding 34 is covered with a covering formed of, for example, resin (reference numeral 35 in FIG. 3). The covering is omitted from the illustration in FIG. 2.

The outside diameter of the center core 31, the outside diameter of the inner cladding 32, the outside diameter of the ring core 33, and the outside diameter of the outer cladding 34 in the output optical fiber 30 are key factors that determine the intensity distribution of a laser beam L emitted from the laser emission portion 4 and may be designed in an adequate manner depending on an application or an output specification of the laser apparatus 1. Particularly, in one or more embodiments, the outside diameter of the outer cladding 34 is designed so as to facilitate fusion splicing of the optical fibers 10, 20 and the output optical fiber 30. As an example, the outside diameter of the center core 31 is 100 µm, the outside diameter of the inner cladding 32 (the inside diameter of the ring core 33) is 150 µm, the outside diameter of the ring core 33 is 300 µm, and the outside diameter of the outer cladding 34 is 330 µm. The refractive index of the inner cladding 32 may be the same as or different from the refractive index of the outer cladding 34.

Figure 3:
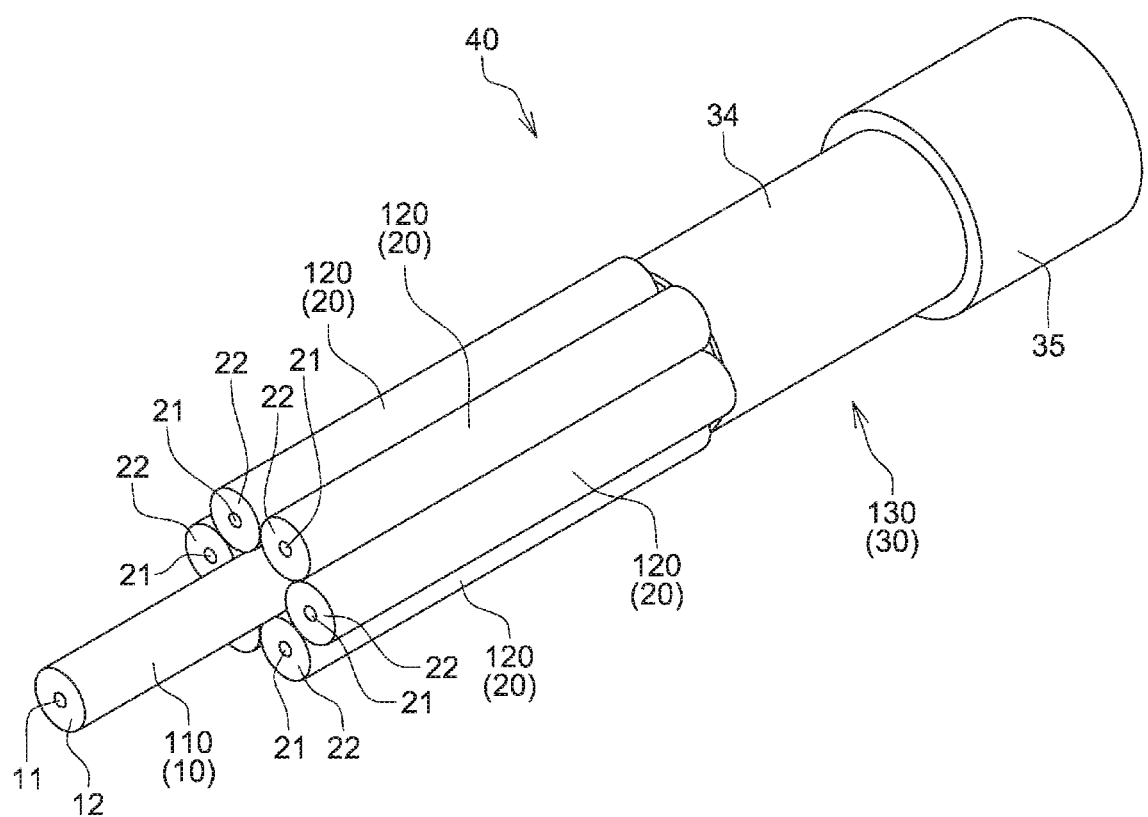
FIG. 3 is a perspective view showing an optical combiner in the laser apparatus illustrated in FIG. 1.
Figure 4:
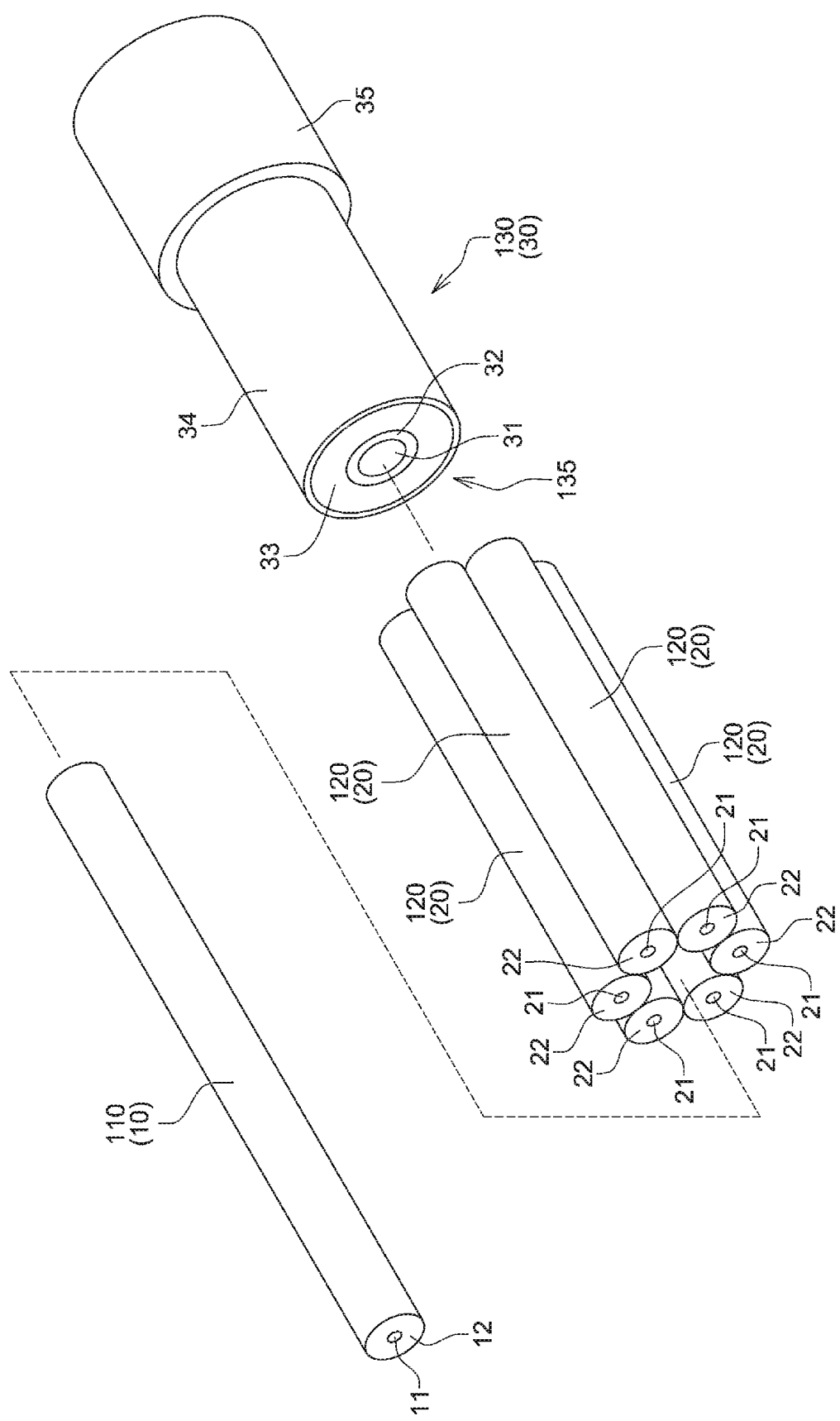
FIG. 4 is an exploded perspective view of the optical combiner illustrated in FIG. 3.

FIG. 3 is a perspective view showing the optical combiner 40, and FIG. 4 is an exploded perspective view of the optical combiner 40. As shown in FIGS. 3 and 4, the optical combiner 40 of one or more embodiments includes an optical input portion 110 (first optical input portion), which is formed by a downstream end of the optical fiber 10 extending from the laser beam source 2, and a plurality of optical input portions 120 (first optical input portions), which are formed by respective downstream ends of the optical fibers 20 extending from the laser beam sources 3, and an optical output portion 130, which is formed by an upstream end of the output optical fiber 30.

As shown in FIGS. 3 and 4, the optical fiber 10, which forms the optical input portion 110, includes a core 11 and a cladding 12 that surrounds an outer circumference of the core 11. The cladding 12 has a refractive index lower than a refractive index of the core 11. For example, the core 11 may be formed of silica glass ($SiO_2$), and a dopant having a property to lower the refractive index (e.g., fluorine (F) or boron (B)) may be doped to the silica glass to form the cladding 12. Alternatively, the cladding 12 may be formed of silica glass ($SiO_2$), and a dopant having a property to increase the refractive index (e.g., germanium (Ge)) may be doped to form the core 11. Thus, an interior of the core 11 in the optical fiber 10 forms an optical waveguide (first optical input waveguide) that allows light to propagate therethrough. Therefore, a laser beam generated by the laser beam source 2 propagates through the core 11 of the optical fiber 10. As an example, the outside diameter of the core 11 in the optical fiber 10 is 30 µm, and the outside diameter of the cladding 12 is 125 µm. A portion of an outer circumference of the cladding 12 in the optical fiber 10 that is not illustrated in FIGS. 3 and 4 is covered with a covering (not shown) formed of resin, for example.

Furthermore, the optical fiber 20, which forms the optical input portion 120, includes a core 21 and a cladding 22 that surrounds an outer circumference of the core 21. The cladding 22 has a refractive index lower than a refractive index of the core 21. For example, the core 21 may be formed of silica glass ($SiO_2$), and a dopant having a property to lower the refractive index (e.g., fluorine (F) or boron (B)) may be doped to the silica glass to form the cladding 22. Alternatively, the cladding 22 may be formed of silica glass ($SiO_2$), and a dopant having a property to increase the refractive index (e.g., germanium (Ge)) may be doped to form the core 21. Thus, an interior of the core 21 in the optical fiber 10 forms an optical waveguide (first optical input waveguide) that allows light to propagate therethrough. Therefore, a laser beam generated by the laser beam source 3 propagates through the core 21 of the optical fiber 20. As an example, the outside diameter of the core 21 in the optical fiber 20 is 30 µm, and the outside diameter of the cladding 22 is 125 µm. A portion of an outer circumference of the cladding 22 in the optical fiber 20 that is not illustrated in FIGS. 3 and 4 is covered with a covering (not shown) formed of resin, for example. In one or more embodiments, the optical fiber 10 and the optical fibers 20 are formed by optical fibers having the same configuration and dimension. Nevertheless, the optical fiber 10 and the optical fibers 20 may be formed by optical fibers having different configurations and dimensions.

As shown in FIGS. 3 and 4, an upstream end of the covering 35, which surrounds the outer circumference of the outer cladding 34 of the output optical fiber 30, has been removed so as to expose the outer cladding 34 in the optical output portion 130. The aforementioned optical input portions 110 and 120 are connected by fusion splice to the portion of the optical output portion 130 at which the outer cladding 34 is exposed. Specifically, a downstream end of the optical input portion 110 (optical fiber 10) and downstream ends of optical input portions 120 (optical fibers 20) are connected to an upstream end face (connection end face) 135 of the optical output portion 130 by fusion splice.

Figure 5:
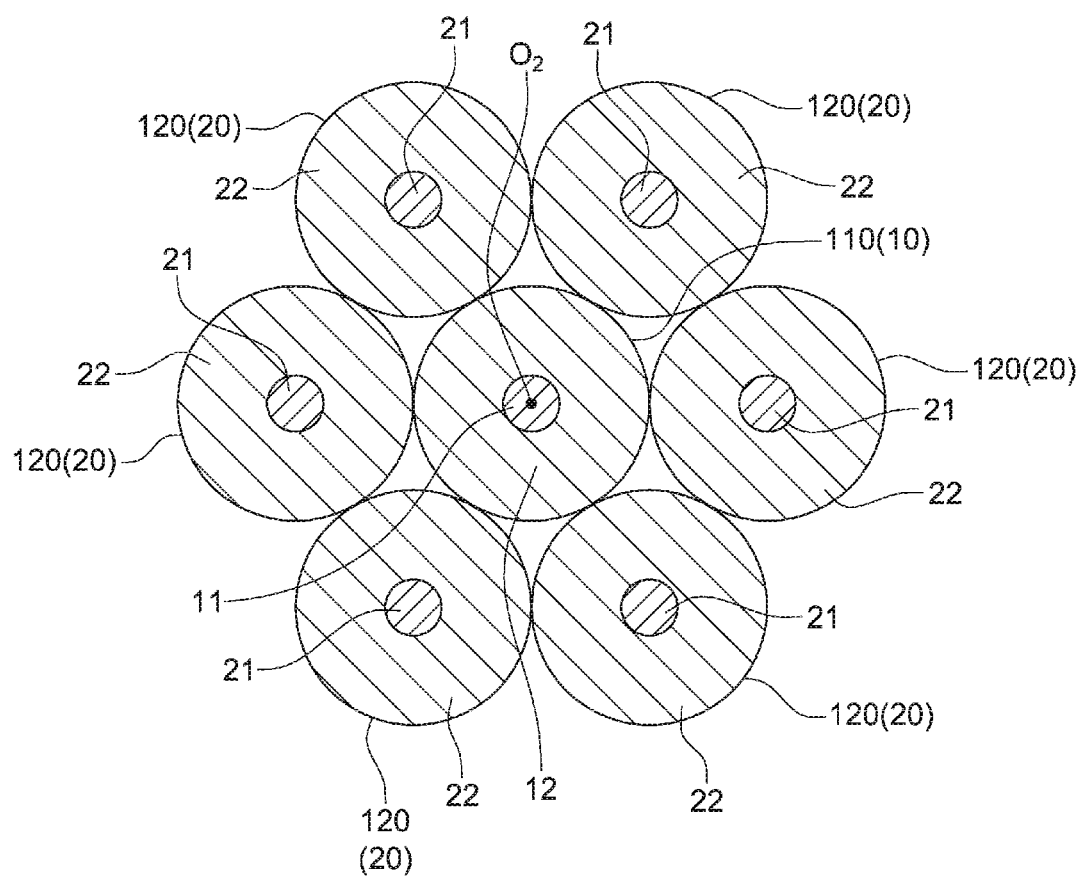
FIG. 5 is cross-sectional view showing downstream ends of optical input portions in the optical combiner illustrated in FIG. 3.

FIG. 5 is cross-sectional view showing downstream ends (connection ends) of the optical input portions 110 and 120 connected to the connection end face 135 of the optical output portion 130. As shown in FIG. 5, with the connection ends of the optical input portion 110, 120, six optical input portions 120 (optical fibers 20) are arranged around one optical input portion 110 (optical fiber 10) equidistantly from a center $O_2$ of the optical fiber 10. Adjacent optical fibers 10 and 20 are brought into contact with each other to establish the closest-packed arrangement. The connection ends of the optical input portions 110 and 120 are connected to the connection end face 135 of the optical output portion 130 by fusion splice such that the center $O_2$ of the optical fiber 10, which is centrally located, is coincident with a center $O_1$ of the output optical fiber 30 (see FIG. 2).

Figure 6:
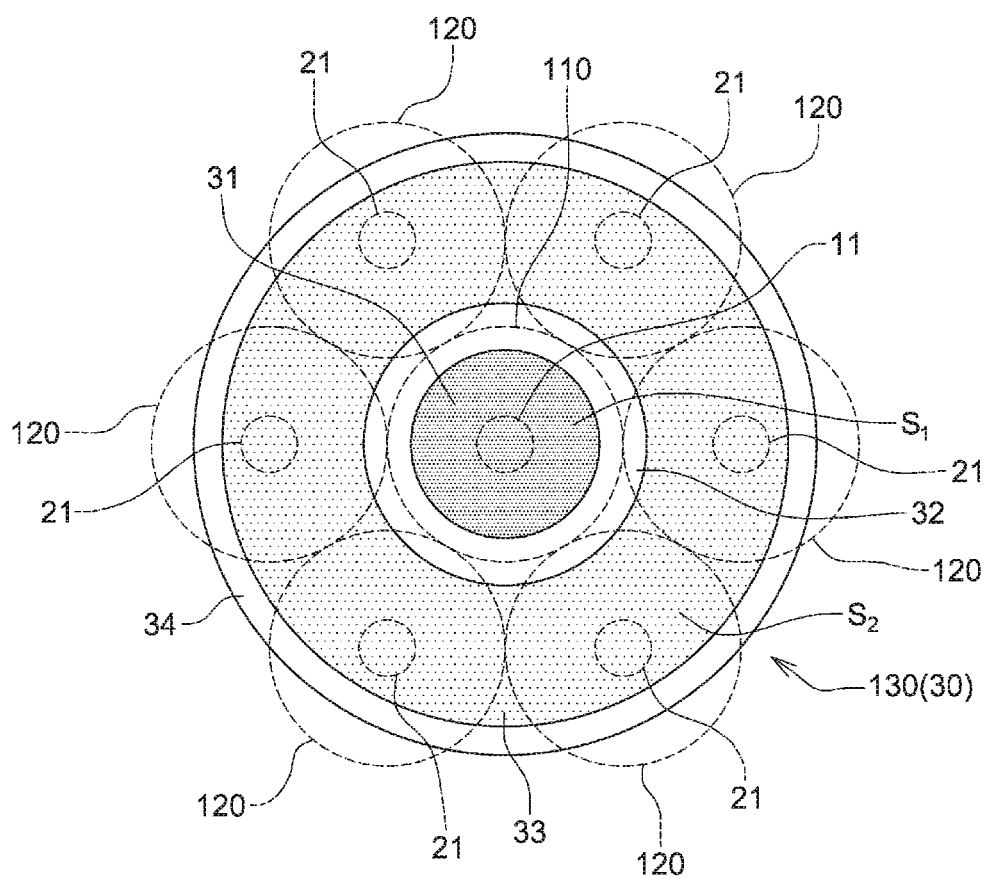
FIG. 6 is a diagram schematically showing a connection relationship between connection ends of the optical input portions and a connection end face of an optical output portion.
Figure 7:
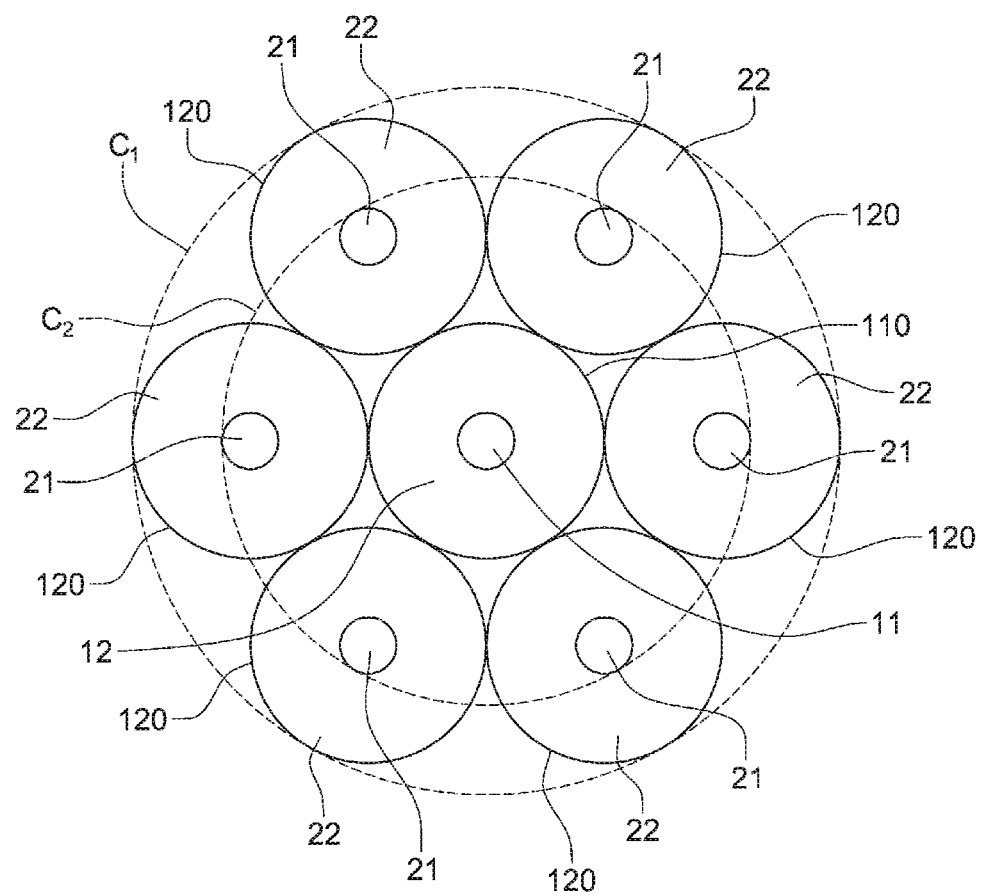
FIG. 7 is a diagram schematically showing the optical input portions illustrated in FIG. 5.

FIG. 6 is a diagram schematically showing a connection relationship between the connection ends of the optical input portions 110 and 120 and the connection end face 135 of the optical output portion 130. As shown in FIG. 6, an area $S_1$ of the center core 31 in the optical output portion 130 (inner hatched area) has such a size as to encompass therein the core 11 of the optical input portion 110, which is centrally located. Furthermore, an area $S_2$ of the ring core 33 in the optical output portion 130 (outer hatched area) has such a size as to encompass therein all of the cores 21 of the six optical input portions 120. The optical input portions 110 and 120 are connected to the optical output portion 130 by fusion splice such that the core 11 of the optical input portion 110 is located within an area of the center core 31 of the optical output portion 130 while all of the cores 21 of the optical input portions 120 are located within an area of the ring core 33 of the optical output portion 130.

With this configuration, a laser beam generated by the laser beam source 2 propagates through the core 11 of the optical fiber 10, reaches the optical input portion 110 of the optical combiner 40, and enters the center core 31 of the optical output portion 130. The laser beam that has entered the center core 31 of the optical output portion 130 propagates through the center core 31 of the output optical fiber 30, so that the laser beam is directed as a portion of the laser beam L to the workpiece W on the stage 6 from the laser emission portion 4 (see FIG. 1).

Furthermore, a laser beam generated by the laser beam source 3 propagates through the core 21 of the optical fiber 20, reaches the optical input portion 120 of the optical combiner 40, and enters the ring core 33 of the optical output portion 130. The laser beam that has entered the ring core 33 of the optical output portion 130 propagates through the ring core 33 of the output optical fiber 30, so that the laser beam is directed as a portion of the laser beam L to the workpiece W on the stage 6 from the laser emission portion 4 (see FIG. 1).

In this manner, according to the laser apparatus 1 of one or more embodiments, the laser beam L including the laser beam generated by the laser beam source 2 on its central side and the laser beams generated by the laser beam sources 3 on its outer side is directed to the workpiece W on the stage 6 from the laser emission portion 4.

As shown in FIG. 1, a light removal portion 7 is provided on the output optical fiber 30 between the optical combiner 40 and the laser emission portion 4 for removing residual light (cladding mode) that has leaked out of the center core 31 or the ring core 33 of the output optical fiber 30 to the outer cladding 34. Any structure known in the art (cladding mode stripper) may be used for the light removal portion 7, and the details of the light removal portion 7 are omitted herein. Since the light removal portion 7 can remove unnecessary light that has leaked out of the center core 31 or the ring core 33 of the output optical fiber 30 to the outer cladding 34, adverse influence from such unnecessary light on the laser beam L emitted from the laser emission portion 4 can be suppressed.

For example, the controller 5 can control the laser beam sources 2 and 3 by controlling electric currents supplied to the laser beam sources 2 and 3. Thus, the controller 5 can control the laser beam sources 2 and 3 to change a power of the laser beam generated by the laser beam source 2 and a power of the laser beams generated by the laser beam sources 3. Therefore, a power of the laser beam L outputted from the laser emission portion 4 of the laser apparatus 1 can be adjusted on its central region and its peripheral region, respectively, so that a profile of the laser beam L can readily be varied.

In the above example, an outside diameter $D_1$ of the outer cladding 34 (see FIG. 2) on the connection end face 135 of the optical output portion 130 is 330 μm, which is less than a diameter of a circle $C_1$ (see FIG. 7) circumscribed with the claddings 22 of the optical input portions 120 (125 μm×3=375 μm). Thus, in the optical combiner 40 of one or more embodiments, the outside diameter $D_1$ of the outer cladding 34 (see FIG. 2) on the connection end face 135 of the optical output portion 130 is less than the diameter of the smallest inclusive circle $C_1$ (see FIG. 7), which includes all of the claddings 22 of the optical input portions 120 on the connection end face 135 of the optical output portion 130. Therefore, a required amount of heating the optical output portion 130 can be reduced when the optical input portions 110 and 120 and the optical output portion 130 are connected to each other by fusion splice. Accordingly, needs for taking countermeasures, such as heating the optical output portion 130 more intensely than the optical input portions 110 and 120, can be reduced, thereby facilitating fusion splicing of the optical input portions 110 and 120 and the optical output portion 130.

Furthermore, if the optical input portions 110 and 120 are excessively heated, refractive index profiles of the optical input portions 110 and 120 may be varied near the fusion splicing portion by diffusion of the dopant. Thus, the beam quality (e.g., an angle of divergence of the laser beam, $M^2$, a beam parameter product (BPP), or the like) of the laser beam outputted from the optical combiner 40 may be degraded. Particularly, the cores 11 and 21 of the optical input portions 110 and 120 are smaller in diameter than the center core 31 and the ring core 33 of the optical output portion 130. Therefore, refractive index profiles of the optical input portions 110 and 120 may be varied to a larger degree by diffusion of the heated dopant. The beam quality may be likely to be degraded. In this regard, according to one or more embodiments, the outside diameter $D_1$ of the outer cladding 34 of the optical output portion 130 is greater than the diameter of the circle $C_1$ circumscribed with the claddings 22 of the optical input portions 120. Therefore, the optical input portions 110 and 120 are less likely to be excessively heated. Degradation of the beam quality of the laser beam outputted from the optical combiner 40 can be suppressed.

Meanwhile, the cores 21 of the optical input portions 120 need to be optically coupled to the area $S_2$ (see FIG. 6) of the ring core 33 of the optical output portion 130. For that purpose, an outside diameter of the ring core 33 is greater than a diameter of a circle circumscribed with at least one of the cores 21 of the optical input portions 120. Furthermore, an outside diameter $D_1$ of the outer cladding 34, which is located outside of the ring core 33, is also greater than a diameter of a circle circumscribed with at least one of the cores 21 of the optical input portions 120. In one or more embodiments, in order to increase an optical coupling efficiency, the outside diameter of the ring core 33 and the outside diameter $D_1$ of the outer cladding 34 are greater than the diameter of the smallest inclusive circle $C_2$ (see FIG. 7), which includes all of the cores 11 and 21 of the optical input portions 110 and 120 on the connection end face 135 of the optical output portion 130 (280 μm in the above example).

There are gaps formed between the optical input portions 110 and 120 prior to fusion splice. A total surface area of the claddings 12 and 22 of the optical input portions 110 and 120 to be heated is greater than a surface area of the outer cladding 34 of the optical output portion 130. Therefore, the heating efficiency is higher for the optical input portions 110 and 120 than for the optical output portion 130. As a result, the optical output portion 130 needs to be heated more intensely than the optical input portions 110 and 120. From this point of view, the area of a cross section of the optical output portion 130 (the output optical fiber 30) on the connection end face 135 may be equal to or smaller than the total area of cross sections of the optical input portions 110 and 120 (the optical fibers 10 and 20) on the connection end face 135 in order to reduce a required amount of heating the optical output portion 130 when the optical input portions 110 and 120 and the optical output portion 130 are connected to each other by fusion splice. In the above example, the area of a cross section of the optical input portions 110 and 120 on the connection end face 135 is 85,903 μm², and the area of a cross section of the optical output portion 130 is 85,530 μm². In the specification, when the area of a cross section of the optical output portion on the connection end face is described as being equal to a certain value, such the area of a cross section shall include a range of ±20% from the value, which includes manufacturing errors.

In the above example, all of the cores 21 and the claddings 22 of the optical input portions 120 have the same diameters. The optical input portions 120 are arranged equidistantly from the center $O_1$ of the output optical fiber 30 (the center $O_2$ of the optical fiber 10). Therefore, the circle $C_1$ circumscribed with the claddings 22 of the optical input portions 120 touches all of the claddings 22 of the optical input portions 120. The circle $C_2$ circumscribed with the cores 21 of the optical input portions 120 touches all of the cores 21 of the optical input portions 120. However, the present invention is applicable to other cases. Specifically, in a case where diameters of the cores 21 and the claddings 22 or distances from the center $O_1$ of the output optical fiber 30 to the cores 21 and the claddings 22 differ from one optical input portion 120 to another, the outside diameter $D_1$ of the outer cladding 34 of the optical output portion 130 on the connection end face 135 may be set to be less than a diameter of the smallest inclusive circle including all of the claddings 22 of the optical input portions 120 and greater than a diameter of a circle circumscribed with one of the cores 21 of the optical input portions 120 (e.g., the core 21 located on an outermost side from the center $O_1$ of the output optical fiber 30). Furthermore, the outside diameter of the ring core 33 of the optical output portion 130 on the connection end face 135 may be set to be greater than a diameter of the smallest inclusive circle including all of the cores 21 of the optical input portions 120.

Figure 8:
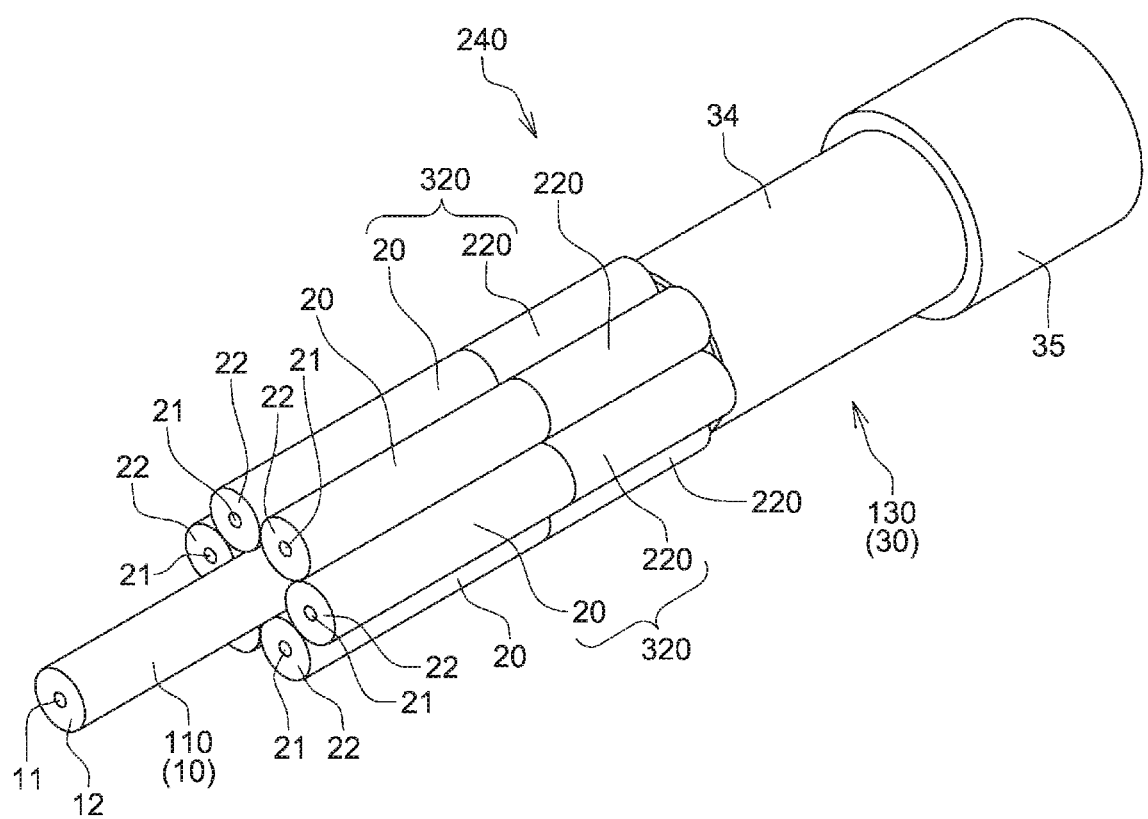
FIG. 8 is a perspective view showing an optical combiner according to one or more embodiments of the present invention.
Figure 9:
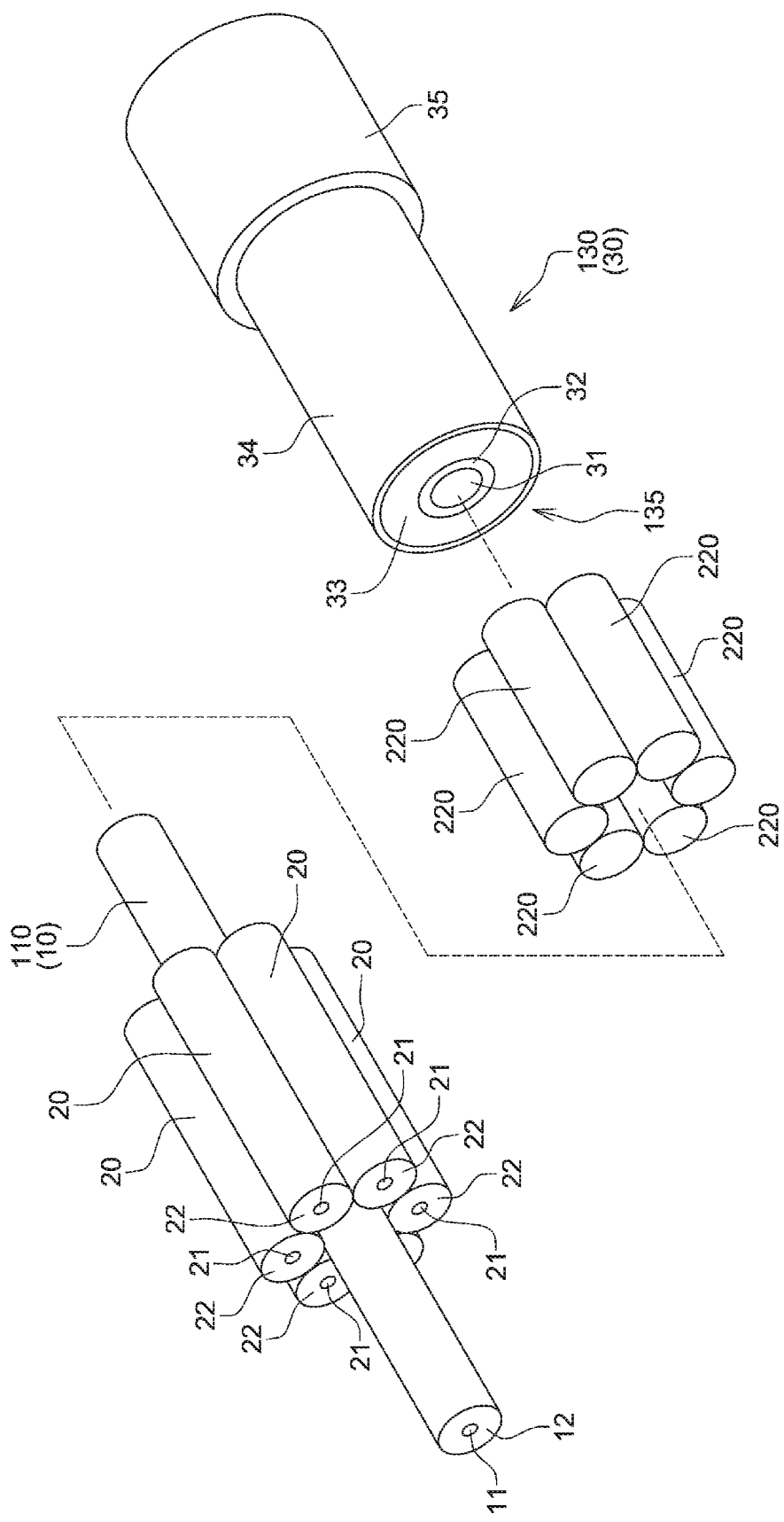
FIG. 9 is an exploded perspective view of the optical combiner illustrated in FIG. 8.

FIG. 8 is a perspective view showing an optical combiner 240 according to one or more embodiments of the present invention, and FIG. 9 is an exploded perspective view thereof. As shown in FIGS. 8 and 9, the optical combiner 240 of one or more embodiments includes an optical input portion 110 (first optical input portion), which is formed by a downstream end of the optical fiber 10, optical input portions 320 (first optical input portions), which are formed by downstream ends of the optical fibers 20 and optical adjustment members 220, and an optical output portion 130, which is formed by an upstream end of the output optical fiber 30. Upstream end faces of the optical adjustment members 220 in the optical input portions 320 are connected to the downstream ends of the optical fibers 20 by fusion splice, and downstream end faces of the optical adjustment members 220 are connected to the connection end face 135 of the optical output portion 130 by fusion splice.

Each of the optical adjustment members 220 is a cylindrical member that changes an emission angle of a laser beam that has propagated through the core 21 of the optical fiber 20 to direct the laser beam to the ring core 33 of the output optical fiber 30. An area from the central axis of the cylindrical member to a predetermined diameter forms an optical waveguide (first optical input waveguide) for the laser beam. In one or more embodiments, this area of the optical waveguide in the optical adjustment member 220 corresponds to the area of the core 21 of the optical input portion 120 in the aforementioned embodiments. Thus, a laser beam that has propagated through the core 21 of the optical fiber 20 is directed to the ring core 33 of the output optical fiber 30 after an emission angle of the laser beam has been changed. As a result, a beam profile of the laser beam L emitted from the laser emission portion 4 can be adjusted into a desired form. As an example, an outside diameter of the optical adjustment member 220 is 125 μm.

When an emission angle of light that has propagated through the core 21 of the optical fiber 20 is to be reduced, for example, a GRIN (Graded Index or Gradient Index) lens member having a refractive index that gradually decreases radially outward from the central axis may be used as the optical adjustment member 220. For example, such a GRIN lens member may be formed by doping a high concentration of a dopant such as germanium (Ge) to a central portion of cylindrical glass made of quartz. In this case, a portion of the optical adjustment member 220 where the refractive index decreases radially outward from the central axis in a parabolic manner forms an optical waveguide for a laser beam.

When an emission angle of light that has propagated through the core 21 of the optical fiber 20 is to be increased, for example, a lens member having a refractive index that gradually increases radially outward from the central axis may be used as the optical adjustment member 220. For example, such a lens member may be formed by doping a high concentration of a dopant such as germanium (Ge) to a peripheral portion of cylindrical glass made of quartz. In this case, a portion of the optical adjustment member 220 where the refractive index increases radially outward from the central axis in a parabolic manner forms an optical waveguide for a laser beam.

When an emission angle of light that has propagated through the core 21 of the optical fiber 20 is to be increased, for example, an optical fiber with a diameter reduced toward the output optical fiber 30 may be used as the optical adjustment member 220. For example, such an optical fiber may be formed by drawing the same optical fiber as the optical fiber 20 such that an outside diameter of the optical fiber is reduced toward to the output optical fiber 30. In this case, a core region of the optical fiber used as the optical adjustment member 220 forms an optical waveguide for a laser beam.

In one or more embodiments, an outside diameter $D_1$ of the outer cladding 34 (see FIG. 2) on the connection end face 135 of the optical output portion 130 is less than a diameter of a circle circumscribed with the six optical adjustment members 220 in the optical input portion 320. Specifically, the outside diameter $D_1$ of the outer cladding 34 on the connection end face 135 of the optical output portion 130 is less than a diameter of the smallest inclusive circle, which includes all of the optical input portions 320 (optical adjustment members 220) among the optical input portions 110 and 320 on the connection end face 135 of the optical output portion 130. Therefore, a required amount of heating the optical output portion 130 can be reduced when the optical input portions 110 and 320 and the optical output portion 130 are connected to each other by fusion splice. Accordingly, needs for taking countermeasures, such as heating the optical output portion 130 more intensely than the optical input portions 110 and 320, can be reduced, thereby facilitating fusion splicing of the optical input portions 110 and 320 and the optical output portion 130.

In one or more embodiments, each of the optical input portions 320 includes an optical adjustment member 220. However, only a portion of the optical input portions 320 may include an optical adjustment member 220. Furthermore, the optical input portion 110 may include an optical adjustment member similar to the optical adjustment member 220.

Figure 10:
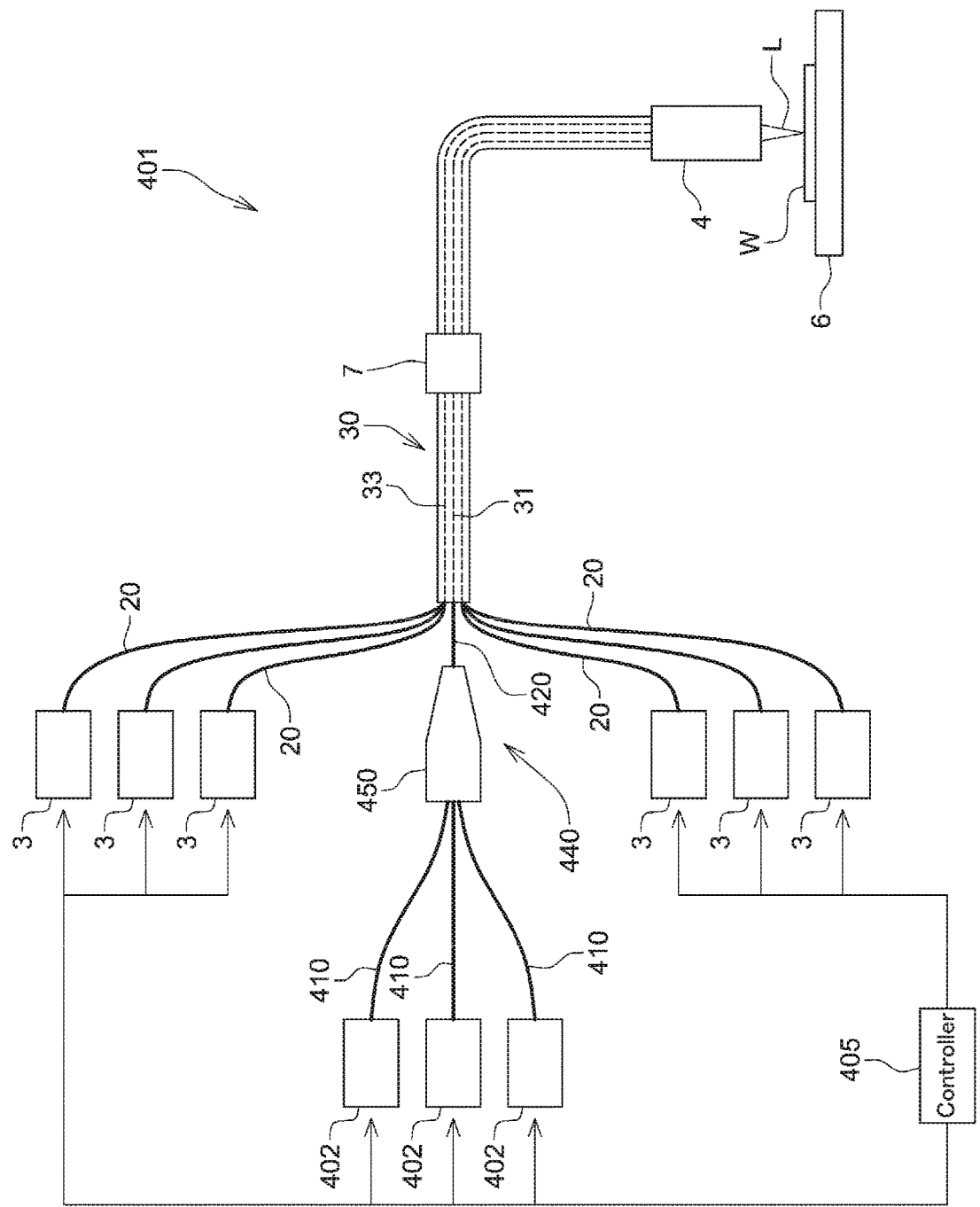
FIG. 10 is a schematic block diagram showing a configuration of a laser apparatus according to one or more embodiments of the present invention.

FIG. 10 is a schematic block diagram showing a configuration of a laser apparatus 401 according to one or more embodiments of the present invention. As shown in FIG. 10, the laser apparatus 401 of one or more embodiments includes a plurality of laser beam sources 3 operable to generate a laser beam, optical fibers 20 connected to the laser beam sources 3, a plurality of laser beam sources 402 operable to generate a laser beam, optical fibers 410 connected to the laser beam sources 402, an optical combiner 440 operable to combine the laser beams propagating through the optical fibers 20 and 410 and direct the combined laser beams to the output optical fiber 30, and a controller 405 operable to control the laser beam sources 3 and 402. For example, a fiber laser or a semiconductor laser may be employed for the laser beam sources 402.

Figure 11:
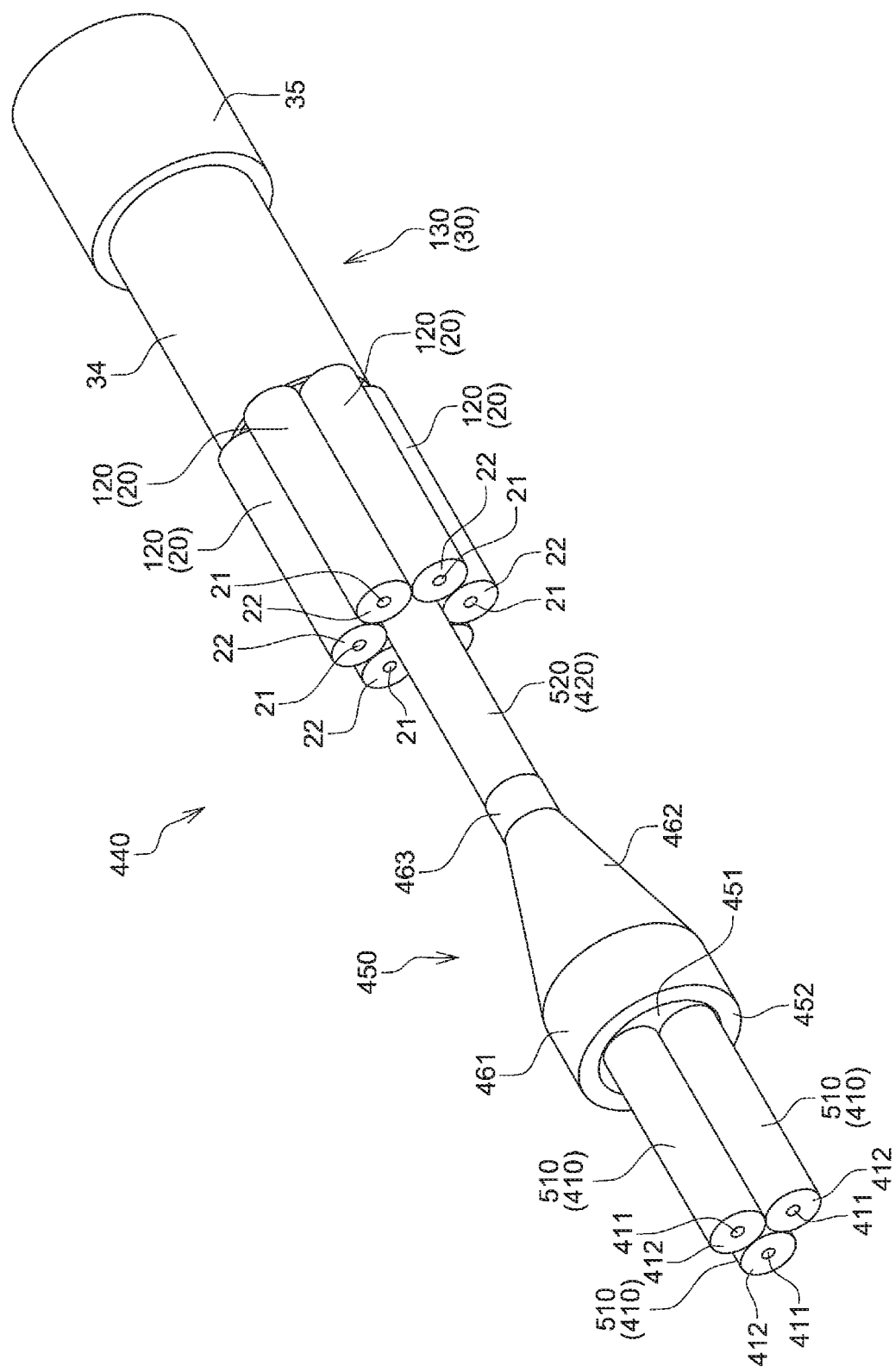
FIG. 11 is a perspective view showing an optical combiner in the laser apparatus illustrated in FIG. 10.
Figure 12:
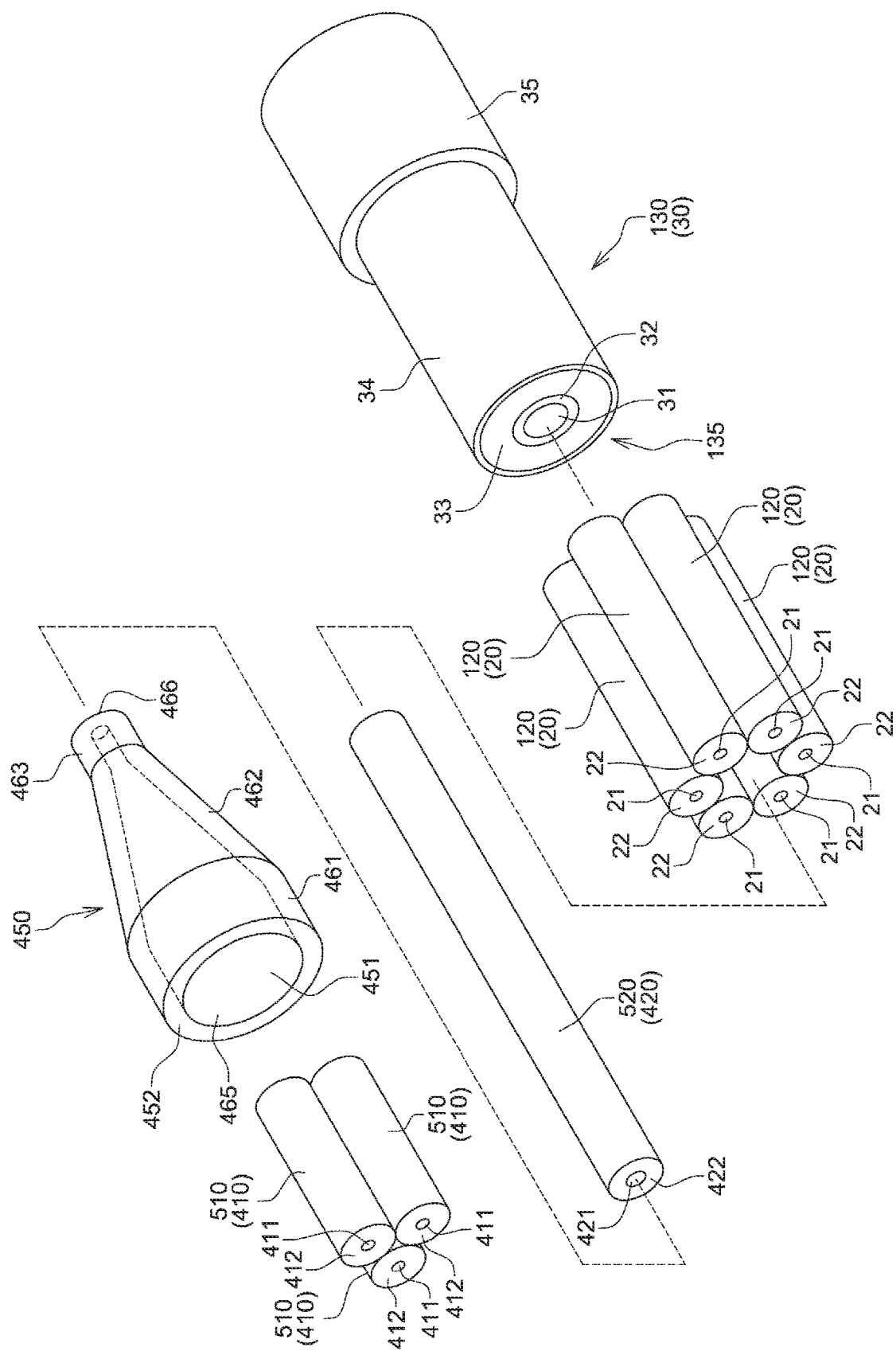
FIG. 12 is an exploded perspective view of the optical combiner illustrated in FIG. 11.

FIG. 11 is a perspective view showing the optical combiner 440, and FIG. 12 is an exploded perspective view thereof. As shown in FIGS. 11 and 12, the optical combiner 440 of one or more embodiments includes a plurality of optical input portions 120 (first optical input portions), which are formed by downstream ends of the optical fibers 20 extending from the laser beam sources 3, a plurality of optical input portions 510 (second optical input portions), which are formed by downstream ends of the optical fibers 410 extending from the laser beam sources 402, a bridge fiber 450 connected to those optical input portions 510, an optical input portion 520 (first optical input portion), which is formed by an intermediate optical fiber 420 connected to a downstream side of the bridge fiber 450, and an optical output portion 130, which is formed by an upstream end of the output optical fiber 30.

As described in the aforementioned embodiments, an optical waveguide (first optical input waveguide) that allows light to propagate therethrough is formed within the core 21 of the optical fiber 20, which forms the optical input portion 120. A laser beam generated by the laser beam source 3 propagates through the core 21 of the optical fiber 20 and reaches the optical input portion 120 of the optical combiner 440.

As shown in FIGS. 11 and 12, the optical fiber 410, which forms the optical input portion 510, includes a core 411 and a cladding 412 that surrounds an outer circumference of the core 411. The cladding 412 has a refractive index lower than a refractive index of the core 411. For example, the core 411 may be formed of silica glass ($SiO_2$), and a dopant having a property to lower the refractive index (e.g., fluorine (F) or boron (B)) may be doped to the silica glass to form the cladding 412. Alternatively, the cladding 412 may be formed of silica glass ($SiO_2$), and a dopant having a property to increase the refractive index (e.g., germanium (Ge)) may be doped to form the core 411. Thus, an interior of the core 411 in the optical fiber 410 forms an optical waveguide (second optical input waveguide) that allows light to propagate therethrough. Therefore, a laser beam generated by the laser beam source 402 propagates through the core 411 of the optical fiber 410 and reaches the optical input portion 510 of the optical combiner 440. As an example, the outside diameter of the core 411 in the optical fiber 410 is 30 μm, and the outside diameter of the cladding 412 is 125 μm. A portion of an outer circumference of the cladding 412 in the optical fiber 410 that is not illustrated in FIGS. 11 and 12 is covered with a covering (not shown) formed of resin, for example. In one or more embodiments, the optical fiber 410 and the optical fibers 20 are formed by optical fibers having the same configuration and dimension. Nevertheless, the optical fiber 410 and the optical fibers 20 may be formed by optical fibers having different configurations and dimensions.

As shown in FIG. 12, the intermediate optical fiber 420, which forms the optical input portion 520, includes a core 421 and a cladding 422 that surrounds an outer circumference of the core 421. The cladding 422 has a refractive index lower than a refractive index of the core 421. Thus, an interior of the core 421 in the optical fiber 420 forms an optical waveguide (first optical input waveguide) that allows light to propagate therethrough.

The bridge fiber 450 includes a core 451 and a cladding 452 that surrounds an outer circumference of the core 451. The cladding 452 has a refractive index lower than a refractive index of a core 451. Thus, an interior of the core 451 forms an optical waveguide that allows light to propagate therethrough. The bridge fiber 450 with such a core-cladding structure includes a first cylindrical portion 461 extending along an optical axis with a fixed outside diameter, a diameter reduction portion 462 having an outside diameter gradually reduced from the first cylindrical portion 461 along the optical axis, and a second cylindrical portion 463 extending from the diameter reduction portion 462 along the optical axis with a fixed outside diameter.

The first cylindrical portion 461 has an end face that serves as a bridge input surface 465 to which downstream ends of the respective optical input portions 510 are connected by fusion splicing. In one or more embodiments, the three optical input portions 510 are connected to the bridge input surface 465 of the bridge fiber 450 in a state in which the optical input portions 510 are held in contact with each other. The size of the core 451 of the bridge fiber 450 on the bridge input surface 465 is large enough to include therein all of the cores 411 of the optical input portions 510. The optical input portions 510 and the bridge fiber 450 are connected to each other by fusion splice in a state in which all of the cores 411 of the three optical input portions 510 are located within an area of the core 451 on the bridge input surface 465 of the bridge fiber 450.

In this manner, the bridge fiber 450 is configured to allow laser beams emitted from the cores 411 of the optical input portions 510 to propagate through an interior of the core 451 and reduce the beam diameter of the laser beams through the diameter reduction portion 462. In order to suppress reflection of a laser beam when the laser beam enters the core 451 of the bridge fiber 450 from the cores 411 of the optical input portions 510, the core 451 of the bridge fiber 450 may have a refractive index that is substantially the same as a refractive index of the cores 411 of the optical input portions 510.

An end face of the second cylindrical portion 463 that is located opposite to the bridge input surface 465 along the optical axis serves as a bridge output surface 466 to which the intermediate optical fiber 420 is connected by fusion splice. The size of the core 421 of the intermediate optical fiber 420 is equal to or greater than the size of the core 451 of the bridge fiber 450 on the bridge output surface 466. The bridge fiber 450 and the optical input portion 520 (intermediate optical fiber 420) are connected to each other by fusion splice in a state in which the core 451 of the bridge fiber 450 on the bridge output surface 466 is located within an area of the core 421 of the intermediate optical fiber 420.

In this manner, the intermediate optical fiber 420 of the optical input portion 520 is configured to allow the laser beam that has propagated through the core 451 of the bridge fiber 450 to propagate through an interior of the core 421. In order to suppress reflection of a laser beam when the laser beam enters the core 421 of the intermediate optical fiber 420 from the core 451 of the bridge fiber 450, the core 421 of the intermediate optical fiber 420 may have a refractive index that is substantially the same as a refractive index of the core 451 of the bridge fiber 450.

In one or more embodiments, the bridge fiber 450 includes the cladding 452, which is formed around the core 451, as a low-refractive-index medium having a refractive index lower than the refractive index of the core 451. Such a low-refractive-index medium is not limited to a covering layer such as the cladding 452. For example, an air layer may be formed around the core 451 and may be used as a low-refractive-index medium.

Downstream ends of the optical input portions 120 (optical fibers 20) and a downstream end of the optical input portion 520 (intermediate optical fiber 420) are connected to the connection end face 135 of the optical output portion 130 by fusion splice. At the downstream ends (connection ends) of the optical input portions 120 and the optical input portion 520, the six optical input portions 120 (optical fibers 20) are arranged around the optical input portion 520 (intermediate optical fiber 420) equidistantly from the center of the intermediate optical fiber 420. Adjacent optical fibers 20 and 420 are brought into contact with each other to establish the closest-packed arrangement. The connection ends of the optical input portions 120 and 520 are connected to the connection end face 135 of the optical output portion 130 by fusion splice such that the center of the intermediate optical fiber 420, which is centrally located, is coincident with the center $O_1$ of the output optical fiber 30 (see FIG. 2).

An area of the center core 31 in the optical output portion 130 has such a size as to encompass therein the core 421 of the optical input portion 520, which is centrally located. An area of the ring core 33 in the optical output portion 130 has such a size as to encompass therein all of the cores 21 of the six optical input portions 120. The optical input portions 120 and 520 are connected to the optical output portion 130 by fusion splice such that the core 421 of the optical input portion 520 is located within an area of the center core 31 of the optical output portion 130 while all of the cores 21 of the optical input portions 120 are located within an area of the ring core 33 of the optical output portion 130.

With this configuration, a laser beam generated by each of the laser beam sources 402 propagates through the core 411 of the optical fiber 410 and enters the core 451 of the bridge fiber 450 from the bridge input surface 465 of the bridge fiber 450. The laser beam that has entered the core 451 of the bridge fiber 450 propagates through the core 451 of the bridge fiber 450 while it is reflected on an interface between the core 451 and the cladding 452. The laser beam is reduced in diameter by the diameter reduction portion 462. The laser beam then enters the core 421 of the intermediate optical fiber 420 from the bridge output surface 466. The laser beam that has entered the core 421 of the intermediate optical fiber 420 propagates through the interior of the core 421 and enters the center core 31 of the optical output portion 130. The laser beam that has entered the center core 31 of the optical output portion 130 propagates through an interior of the center core 31. The laser beam is eventually directed to the workpiece W on the stage 6 from the laser emission portion 4 (see FIG. 10).

Furthermore, a laser beam generated by each of the laser beam sources 3 propagates through the core 21 of the optical fiber 20 and enters the ring core 33 of the optical output portion 130. The laser beam that has entered the ring core 33 of the optical output portion 130 propagates through an interior of the ring core 33. The laser beam is eventually directed to the workpiece W on the stage 6 from the laser emission portion 4 (see FIG. 10).

In this manner, according to one or more embodiments, laser beams from a plurality of laser beam sources 402 can be combined by the bridge fiber 450 so as to enter the center core 31 of the optical output portion 130. Therefore, the power of laser beams propagating through the center core 31 of the output optical fiber 30 can readily be increased.

The controller 405 can control the laser beam sources 3 and 402, for example, by controlling electric currents to be supplied to the laser beam sources 3 and 402. Thus, the laser beam sources 3 and 402 can be controlled by the controller 405 to change powers of laser beams generated by the laser beam sources 3 and powers of laser beams generated by the laser beam sources 402. Therefore, the power of the laser beam L outputted from the laser emission portion 4 of the laser apparatus 401 can be adjusted at its central region and its peripheral region, respectively, so that a profile of the laser beam L can readily be varied.

In one or more embodiments, the outside diameter $D_1$ of the outer cladding 34 (see FIG. 2) on the connection end face 135 of the optical output portion 130 is less than a diameter of the smallest inclusive circle, which includes all of the claddings 22 of the optical input portions 120. Therefore, a required amount of heating the optical output portion 130 can be reduced when the optical input portions 120 and 520 and the optical output portion 130 are connected to each other by fusion splice. Accordingly, needs for taking countermeasures, such as heating the optical output portion 130 more intensely than the optical input portions 120 and 520, can be reduced, thereby facilitating fusion splicing of the optical input portions 120 and 520 and the optical output portion 130.

Meanwhile, the cores 21 of the optical input portions 120 need to optically be coupled to an area of the ring core 33 of the optical output portion 130. For that purpose, an outside diameter of the ring core 33 is greater than a diameter of a circle circumscribed with at least one of the cores 21 of the optical input portions 120. Furthermore, an outside diameter $D_1$ of the outer cladding 34, which is located outside of the ring core 33, is also greater than a diameter of a circle circumscribed with at least one of the cores 21 of the optical input portions 120. In one or more embodiments, in order to increase an optical coupling efficiency, the outside diameter of the ring core 33 and the outside diameter $D_1$ of the outer cladding 34 are greater than the diameter of the smallest inclusive circle, which includes all of the cores 11 and 421 of the optical input portions 110 and 520 on the connection end face 135 of the optical output portion 130. In order to further reduce a required amount of heating the optical output portion 130 when the optical input portions 120 and 520 and the optical output portion 130 are connected to each other by fusion splice, the area of a cross section of the optical output portion 130 (the output optical fiber 30) on the connection end face 135 may be equal to or smaller than the total area of cross sections of the optical input portions 120 and 520 (the optical fibers 20 and 420) on the connection end face 135.

In one or more embodiments, at least one of the optical input portions 120 and 520 may include an optical adjustment member as described in the aforementioned embodiments. With such an optical adjustment member, a beam profile of the laser beam L emitted from the laser emission portion 4 can be adjusted into a desired form.

In the above embodiments, the output optical fiber 30 (optical output portion 130) has two optical waveguides including the center core 31 and the ring core 33. However, the output optical fiber 30 may have a single optical waveguide or three or more optical waveguides. Furthermore, cross-sectional shapes of the cores (optical waveguides) included in the output optical fiber 30 are not limited to the illustrated circular and annular shapes.

Furthermore, the output optical fiber 30 (optical output portion 130) of the above embodiments includes two claddings 32 and 34. The output optical fiber 30 may include a single cladding layer or three or more cladding layers. In such a case, the advantageous effects of the present invention can be attained when an outside diameter of a cladding layer located at the outermost position in the optical output portion 130 is reduced in the same manner as described above.

In the aforementioned embodiments, the laser beam source 2, the laser beam sources 3, and the laser beam sources 402 may have the same configuration or may have different configurations. A wavelength of a laser beam generated by the laser beam source 2, a wavelength of laser beams generated by the laser beam sources 3, and a wavelength of laser beams generated by the laser beam sources 402 may be the same or may be different from each other.

Although some embodiments of the present invention have been described, the present invention is not limited to the aforementioned embodiments. It should be understood that various different forms may be applied to the present invention within the technical idea thereof.

As described above, according to one or more embodiments of the present invention, there is provided an optical combiner that can facilitate fusion splicing of an input optical part and an output optical part. The optical combiner has a plurality of first optical input portions each having a first optical input waveguide and an optical output portion to which the plurality of first optical input portions are connected. The optical output portion includes at least one core that allows light to propagate therethrough and an outermost cladding layer located outside of the at least one core with a refractive index lower than a refractive index of the at least one core. The plurality of first optical input portions are connected to a connection end face of the optical output portion such that the first optical input waveguide of at least one of the plurality of first optical input portions is optically coupled to the at least one core of the optical output portion. An outside diameter of the outermost cladding layer on the connection end face of the optical output portion is less than a diameter of a smallest inclusive circle including all of the plurality of first optical input portions on the connection end face of the optical output portion.

With this configuration, an outside diameter of the outermost cladding layer of the optical output portion is less than a diameter of the smallest inclusive circle that includes all of the plurality of first optical input portions. Therefore, a required amount of heating the optical output portion can be reduced when the plurality of first optical input portions and the optical output portion are connected to each other by fusion splice. Accordingly, needs for taking countermeasures, such as heating the optical output portion more intensely than the first optical input portions, can be reduced, thereby facilitating fusion splicing of the plurality of first optical input portions and the optical output portion.

In order to optically couple the first optical input waveguides of the first optical input portions to at least one core of the optical output portion, the outside diameter of the outermost cladding layer on the connection end face of the optical output portion may be greater than a diameter of a circle circumscribed with at least one of the first optical input waveguides of the plurality of first optical input portions on the connection end face of the optical output portion.

The at least one core may include an outermost core located adjacent to and on an inner side of the outermost cladding layer. In this case, an outside diameter of the outermost core on the connection end face of the optical output portion may be greater than a diameter of a circle circumscribed with at least one of the first optical input waveguides of the plurality of first optical input portions on the connection end face of the optical output portion.

For example, the circle circumscribed with at least one of the first optical input waveguides may be a smallest inclusive circle including all of the first optical input waveguides of the plurality of first optical input portions on the connection end face of the optical output portion.

In order to further reduce a required amount of heating the optical output portion when the plurality of first optical input portions and the optical output portion are connected to each other by fusion splice, the area of a cross section of the optical output portion on the connection end face may be equal to or smaller than the total area of cross sections of the plurality of first optical input portions on the connection end face of the optical output portion.

At least one of the plurality of first optical input portions may include a fiber including a core as the first optical input waveguide and a cladding having a refractive index lower than a refractive index of the core and surrounding an outer circumference of the core and an optical adjustment member that changes an emission angle of light propagating through the core of the optical fiber. With such an optical adjustment member, optical characteristics of light entering the core of the optical output portion from the first optical input portions can be adjusted into a desired form.

The optical combiner may further comprise a plurality of second optical input portions each having a second optical input waveguide and a bridge fiber. The bridge fiber has a bridge input surface connected to the second optical input waveguides of the plurality of second optical input portions, a diameter reduction portion having a diameter gradually reduced away from the bridge input surface along an optical axis, and a bridge output surface located opposite to the bridge input surface along the optical axis. At least one of the plurality of first optical input portions includes an intermediate optical fiber including a core connected to the bridge output surface of the bridge fiber. With this configuration, light from a plurality of second optical input portions can be combined by the bridge fiber so as to enter the core of the optical output portion. Therefore, the power of light propagating through the core of the output optical fiber can readily be increased.

The at least one core of the optical output portion may include a plurality of cores. In this case, the optical output portion may include a first core as the at least one core, a first cladding having a refractive index lower than a refractive index of the first core and surrounding an outer circumference of the first core, a second core as the at least one core, and a second cladding as the outermost cladding layer having a refractive index lower than a refractive index of the second core and surrounding an outer circumference of the second core. The second core has a refractive index higher than a refractive index of the first cladding and surrounds an outer circumference of the first cladding.

According to one or more embodiments of the present invention, there is provided a laser apparatus that can facilitate fusion splicing of an input optical part and an output optical part. The laser apparatus has a plurality of laser beam sources operable to generate a laser beam and the aforementioned optical combiner. The first optical input waveguides of the plurality of first optical input portions in the optical combiner are optically coupled to the plurality of laser beam sources.

According to this aspect, a required amount of heating the optical output portion can be reduced when the plurality of first optical input portions and the optical output portion are connected to each other by fusion splice as described above. Accordingly, needs for taking countermeasures, such as heating the optical output portion more intensely than the first optical input portions, can be reduced, thereby facilitating fusion splicing of the plurality of first optical input portions and the optical output portion.

The laser apparatus may further have a light removal portion operable to remove light that has leaked to the outermost cladding layer of the optical output portion in the optical combiner. With this light removal portion, unnecessary light that has leaked to the outermost cladding layer of the optical output portion in the optical combiner can be removed.

The laser apparatus may further have a controller operable to control the plurality of laser beam sources to adjust outputs of laser beams generated by the plurality of laser beam sources. With this controller, a power of the laser beam outputted from the laser apparatus can be adjusted, so that a profile of the laser beam can readily be varied.

This application claims the benefit of priority from Japanese patent application No. 2020-091710, filed on May 26, 2020, the disclosure of which is incorporated herein in its entirety by reference.

The present invention may be used for an optical combiner configured to combine light beams propagating through a plurality of optical fibers and output the combined light.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 Laser apparatus
2, 3, 402 Laser beam source
4 Laser emission portion
5 Controller
6 Stage
7 Light removal portion
10, 20 Optical fiber
30 Output optical fiber
31 Center core (first core)
32 Inner cladding (first cladding)
33 Ring core (second core)
34 Outer cladding (second cladding)
40, 240, 440 Optical combiner
110, 120 (First) optical input portion
130 Optical output portion
135 Connection end face
220 Optical adjustment member
320 (First) optical input portion
401 Laser apparatus
405 Controller
410 Optical fiber
420 Intermediate optical fiber
450 Bridge fiber
461 First cylindrical portion
462 Diameter reduction portion
463 Second cylindrical portion
465 Bridge input surface
466 Bridge output surface
510 (Second) optical input portion
520 (First) optical input portion

The invention claimed is:
1. An optical combiner comprising:
first optical input portions each comprising a first optical input waveguide; and
an optical output portion to which the first optical input portions are connected and that comprises:
cores that allow light to propagate therethrough, and
a cladding layer disposed outside of the cores and that has a refractive index lower than refractive indices of the cores, wherein
the first optical input portions are connected to a connection end face of the optical output portion such that the first optical input waveguide of at least one of the first optical input portions is optically coupled to one of the cores of the optical output portion, and
an outside diameter of the cladding layer on the connection end face of the optical output portion is less than a diameter of a smallest inclusive circle including all of the first optical input portions on the connection end face of the optical output portion.

2. The optical combiner according to claim 1, wherein the outside diameter of the cladding layer on the connection end face of the optical output portion is greater than a diameter of a circle circumscribed with the first optical input waveguide of at least one of the first optical input portions on the connection end face of the optical output portion.

3. The optical combiner according to claim 1, wherein
the cores include an outermost core adjacent to and on an inner side of the cladding layer, and
an outside diameter of the outermost core on the connection end face of the optical output portion is greater than a diameter of a circle circumscribed with the first optical input waveguide of at least one of the first optical input portions on the connection end face of the optical output portion.

4. The optical combiner according to claim 2, wherein the circle circumscribed with the first optical input waveguide is a smallest inclusive circle including all of the first optical input waveguide of each of the first optical input portions on the connection end face of the optical output portion.

5. The optical combiner according to claim 1, wherein an area of a cross section of the optical output portion on the connection end face is equal to or smaller than a total area of cross sections of the first optical input portions on the connection end face of the optical output portion.

6. The optical combiner according to claim 1, wherein one or more of the first optical input portions comprises:
an optical fiber comprising:
a core that serves as the first optical input waveguide; and
a cladding that:
has a refractive index lower than a refractive index of the core of the optical fiber, and
surrounds an outer circumference of the core of the optical fiber, and
a lens that changes an emission angle of light propagating through the core of the optical fiber.

7. The optical combiner according to claim 1, further comprising:
second optical input portions each comprising a second optical input waveguide; and
a bridge fiber comprising:
a bridge input surface connected to the second optical input waveguide of each of the second optical input portions;
a diameter reduction portion having a diameter gradually reduced away from the bridge input surface along an optical axis; and
a bridge output surface opposite to the bridge input surface along the optical axis, wherein
one or more of the first optical input portions comprise an intermediate optical fiber comprising a core connected to the bridge output surface of the bridge fiber.

8. The optical combiner according to claim 1, wherein the optical output portion further comprises a cladding, the cores include:
a first core having a refractive index higher than or equal to a refractive index of the cladding; and
a second core surrounds an outer circumference of the cladding and having a refractive index higher than a refractive index of the cladding and higher than or equal to a refractive index of the cladding layer,
the cladding surrounds an outer circumference of the first core, and
the cladding layer surrounds an outer circumference of the second core.

9. A laser apparatus comprising:
laser beam sources each operable to generate a laser beam; and
the optical combiner according to claim 1, wherein
the first optical input waveguide of each of the first optical input portions in the optical combiner is optically coupled to each of the laser beam sources.

10. The laser apparatus according to claim 9, further comprising a light removal portion operable to remove light that has leaked to the cladding layer of the optical output portion in the optical combiner.

11. The laser apparatus according to claim 9, further comprising a controller that controls the laser beam sources and adjusts outputs of laser beams generated by the laser beam sources.

12. The optical combiner according to claim 3, wherein the circle circumscribed with the first optical input waveguide is a smallest inclusive circle including all of the first optical input waveguide of each of the first optical input portions on the connection end face of the optical output portion.

* * * * *